United States Patent
Gu et al.

(10) Patent No.: US 12,362,455 B2
(45) Date of Patent: Jul. 15, 2025

(54) FOLDABLE DISPLAY DEVICE AND METHOD FOR MANUFACTURING SAME

(71) Applicant: BOE Technology Group Co., Ltd., Beijing (CN)

(72) Inventors: Penghao Gu, Beijing (CN); Peng Cai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/769,645

(22) PCT Filed: May 20, 2021

(86) PCT No.: PCT/CN2021/094969
§ 371 (c)(1),
(2) Date: Nov. 24, 2022

(87) PCT Pub. No.: WO2022/241730
PCT Pub. Date: Nov. 24, 2022

(65) Prior Publication Data
US 2024/0145900 A1   May 2, 2024

(51) Int. Cl.
*H04B 5/43* (2024.01)
*G06F 1/16* (2006.01)
(Continued)

(52) U.S. Cl.
CPC ......... *H01Q 1/2266* (2013.01); *G06F 1/1616* (2013.01); *G06F 1/1656* (2013.01);
(Continued)

(58) Field of Classification Search
CPC ....... H04B 5/43; G06F 1/1616; G06F 1/1633; G06F 1/1656; H05K 1/189
See application file for complete search history.

(56) References Cited

U.S. PATENT DOCUMENTS

| 10,615,485 B2 | 4/2020 | Chun et al. |
| 2012/0287003 A1 | 11/2012 | Kao et al. |

(Continued)

FOREIGN PATENT DOCUMENTS

| CN | 204062663 U | 12/2014 |
| CN | 105808000 A | 7/2016 |

(Continued)

*Primary Examiner* — Dennis P Joseph
(74) *Attorney, Agent, or Firm* — IPro, PLLC

(57) ABSTRACT

A foldable display device and a method for manufacturing same are provided, which belong to the field of display technologies. The foldable display device includes a first planar display region (11), a bendable display region (12), and a second planar display region (13) that are sequentially connected in a first direction. The foldable display device includes an NFC antenna module (10) and a support plate (20), a support back film (130), a display panel (30), and a flexible cover plate (140) that are laminated. The NFC antenna module (10) is partially overlapped with at least one planar display region of the first planar display region (11) and the second planar display region (13). When the NFC antenna module (10) is at least partially not overlapped with the bendable display region (12), the NFC antenna module (10) is disposed between the support plate (20) and the support back film (130).

18 Claims, 11 Drawing Sheets

(51) Int. Cl.
  *H01Q 1/22* (2006.01)
  *H04B 5/26* (2024.01)
  *H05K 1/18* (2006.01)
(52) U.S. Cl.
  CPC .............. *H04B 5/26* (2024.01); *H04B 5/43* (2024.01); *H05K 1/189* (2013.01)

(56) References Cited

U.S. PATENT DOCUMENTS

| | | |
|---|---|---|
| 2014/0125538 A1 | 5/2014 | Kanj et al. |
| 2017/0346164 A1 | 11/2017 | Kim et al. |
| 2018/0316379 A1 | 11/2018 | Chang et al. |
| 2019/0103656 A1 | 4/2019 | Shi et al. |
| 2019/0267699 A1 | 8/2019 | Kim et al. |
| 2020/0076065 A1 | 3/2020 | Zhou |
| 2021/0152680 A1* | 5/2021 | Lee .................. H04B 5/26 |
| 2022/0166132 A1 | 5/2022 | Chu et al. |

FOREIGN PATENT DOCUMENTS

| | | |
|---|---|---|
| CN | 106058425 A | 10/2016 |
| CN | 106155190 A | 11/2016 |
| CN | 106229610 A | 12/2016 |
| CN | 106597717 A | 4/2017 |
| CN | 206402224 U | 8/2017 |
| CN | 206611477 U | 11/2017 |
| CN | 109638451 A | 4/2019 |
| CN | 109660642 A | 4/2019 |
| CN | 110324480 A | 10/2019 |
| CN | 111029725 A | 4/2020 |
| CN | 111510534 A | 8/2020 |
| CN | 111697315 A | 9/2020 |
| CN | 211980876 U | 11/2020 |
| CN | 112688721 A | 4/2021 |
| CN | 112736404 A | 4/2021 |
| CN | 112803145 A | 5/2021 |
| KR | 101485569 B1 | 1/2015 |

* cited by examiner

FOLDABLE DISPLAY DEVICE AND METHOD FOR MANUFACTURING SAME

CROSS-REFERENCE TO RELATED APPLICATION

This application is a U.S. national stage of international application No. PCT/CN2021/094969, filed on May 20, 2021, the content of which is herein incorporated by reference in its entirety.

TECHNICAL FIELD

The present disclosure relates to the field of display technologies, and in particular, relates to a foldable display device and a method for manufacturing same.

BACKGROUND

Near-field communication (NFC) is a contactless identification and interconnection technology that enables communication between mobile devices over a short distance to implement identification and data exchange. At present, this technology is widely applied to mobile phones and other display devices. For example, NFC is set in a mobile phone to implement the function of an electronic ticket smart card used for, for example, tickets entry in public transportation.

A display device with an NFC function includes an NFC antenna module, a support plate, and a display panel that are sequentially laminated. The NFC antenna module is disposed on a rear surface of the support plate. During NFC identification, a rear surface of the display device faces a target device, and the NFC antenna module emits a signal to interact with the target device to implement NFC identification between the display device and the target device.

SUMMARY

Embodiments of the present disclosure provide a foldable display device and a method for manufacturing same, such that NFC identification is implemented from a screen side of a foldable display device. The technical solutions are as follows.

According to one aspect, the present disclosure provides a foldable display device. The foldable display device includes a first planar display region, a bendable display region, and a second planar display region that are sequentially connected in a first direction. The foldable display device includes an NFC antenna module and a support plate, a support back film, a display panel, and a flexible cover plate that are laminated. The NFC antenna module is partially overlapped with at least one planar display region of the first planar display region and the second planar display region. When the NFC antenna module is at least partially not overlapped with the bendable display region, the NFC antenna module is disposed between the support plate and the support back film.

In some embodiments, the foldable display device further includes a motherboard and a flexible circuit board (FPC), the support plate is disposed between the NFC antenna module and the motherboard, and the NFC antenna module is electrically connected to the motherboard by the FPC.

In some embodiments, a wiring width of the FPC is greater than or equal to a wiring width of the NFC antenna module.

In some embodiments, the wiring width of the FPC ranges from 2 mm to 5 mm, and the wiring width of the NFC antenna module ranges from 0.1 mm to 2 mm.

In some embodiments, the foldable display device further includes a motherboard and a conductive structure, and the support plate is disposed between the NFC antenna module and the motherboard; and a through hole is provided in the support plate, the conductive structure is disposed in the through hole, and the NFC antenna module is electrically connected to the motherboard by the conductive structure.

In some embodiments, the conductive structure is a conductive adhesive; or the conductive structure is a metal elastic sheet; or the conductive structure is a lead.

In some embodiments, the conductive structure is soldered to the motherboard; or the conductive structure and the motherboard are connected by a crimping adhesive.

In some embodiments, the foldable display device includes one NFC antenna module, and the one NFC antenna module is disposed in the one planar display region of the first planar display region and the second planar display region; or the foldable display device includes two NFC antenna modules, and the two NFC antenna modules are respectively disposed in the first planar display region and the second planar display region.

In some embodiments, the NFC antenna module includes an antenna coil and an antenna feeder line, and the antenna feeder line is electrically connected to the antenna coil; and a wiring width of the antenna feeder line is greater than a wiring width of the antenna coil.

In some embodiments, the wiring width of the antenna coil ranges from 0.1 mm to 2 mm; and the wiring width of the antenna feeder line ranges from 0.5 mm to 5 mm.

In some embodiments, the antenna coil is a copper (Cu) coil or a silver (Ag) coil or an aluminum (Al) coil.

In some embodiments, a wiring distance of the antenna coil ranges from 0.1 mm to 1 mm, and an inductance of the antenna coil is greater than 0.3 µH; and a relative magnetic permeability of the antenna coil is greater than 150, and a magnetic loss of the antenna coil is less than 100.

In some embodiments, the support plate is a metal support plate, and the foldable display device further includes: a magnetic conductive layer, disposed between the support plate and the NFC antenna module.

In some embodiments, a material of the magnetic conductive layer is at least one of ferrite, noncrystal or ferrous nanocrystal.

In some embodiments, the foldable display device further includes: a first adhesive material layer, bonded between the magnetic conductive layer and the support plate; a second adhesive material layer, bonded between the NFC antenna module and the support back film; and a third adhesive material layer, bonded between the support plate and the support back film, wherein a surface of the third adhesive material layer opposite to the support plate is attached to the support plate, and a surface of the first adhesive material layer opposite to the support plate is attached to the support plate.

In some embodiments, a difference between a thickness of the third adhesive material layer and a sum of a thickness of the first adhesive material layer a thickness of the magnetic conductive layer, a thickness of the NFC antenna module, and a thickness of the second adhesive material layer is less than 10 µm.

In some embodiments, the thickness of the first adhesive material layer ranges from 15 µm to 50 µm, the thickness of the magnetic conductive layer ranges from 15 µm to 50 µm, the thickness of the NFC antenna module ranges from 1 µm to 35 μm, and the thickness of the second adhesive material layer ranges from 15 μm to 50 μm.

In some embodiments, the foldable display device further includes a support structure and a fourth adhesive material layer, wherein the support structure includes a rotating shaft region and a planar region, and the fourth adhesive material layer is bonded between the planar region and the support plate.

According to another aspect, the present disclosure provides a method for manufacturing a foldable display device. The method includes: providing a support plate; forming an NFC antenna module on a surface of the support plate; and sequentially forming a support back film, a display panel, and a flexible cover plate on the surface formed with the NFC antenna module.

The technical solutions according to the embodiments of the present disclosure achieves at least the following beneficial effects:

In the embodiments of the present disclosure, the NFC antenna module is disposed between the support plate and the display panel. During NFC identification, a screen side of the foldable display device faces a target device that requires interaction. The NFC antenna module transmits a signal to pass through the display panel to interact with the target device, such that NFC identification from the screen side of the foldable display device is achieved.

BRIEF DESCRIPTION OF THE DRAWINGS

For clearer descriptions of the technical solutions of the embodiments of the present disclosure more clearly, the following briefly describes the accompanying drawings required for describing the embodiments. Apparently, the accompanying drawings in the following description show only some embodiments of the present disclosure, and a person of ordinary skill in the art may still derive other drawings from these accompanying drawings without creative efforts.

REFERENCE NUMERALS AND DENOTATIONS THEREOF

10—NFC antenna module; 20—support plate; 30—display panel; 40—motherboard; 50—FPC; 101—antenna coil; 102—antenna feeder line; 60—conductive structure; 201—through hole; 103—antenna base; 131—groove; 70—magnetic conductive layer; 80—first adhesive material layer; 130—support back film; 150—back film adhesive layer; 140—flexible cover plate; 160—functional module layer; 170—modular adhesive layer; 11—first planar display region; 12—bendable display region; 13—second planar display region; 190—filling layer; 90—second adhesive material layer; 100—third adhesive material layer; 110—support structure; 120—fourth adhesive material layer; 1101—rotating shaft region; 1102—planar region; 1201—hollow; and 180—connecting layer.

DETAILED DESCRIPTION

For clearer descriptions of the objectives, technical solutions, and advantages of the present disclosure clearer, some embodiments of the present disclosure are further described below in detail with reference to the accompanying drawings.

Figure 1:
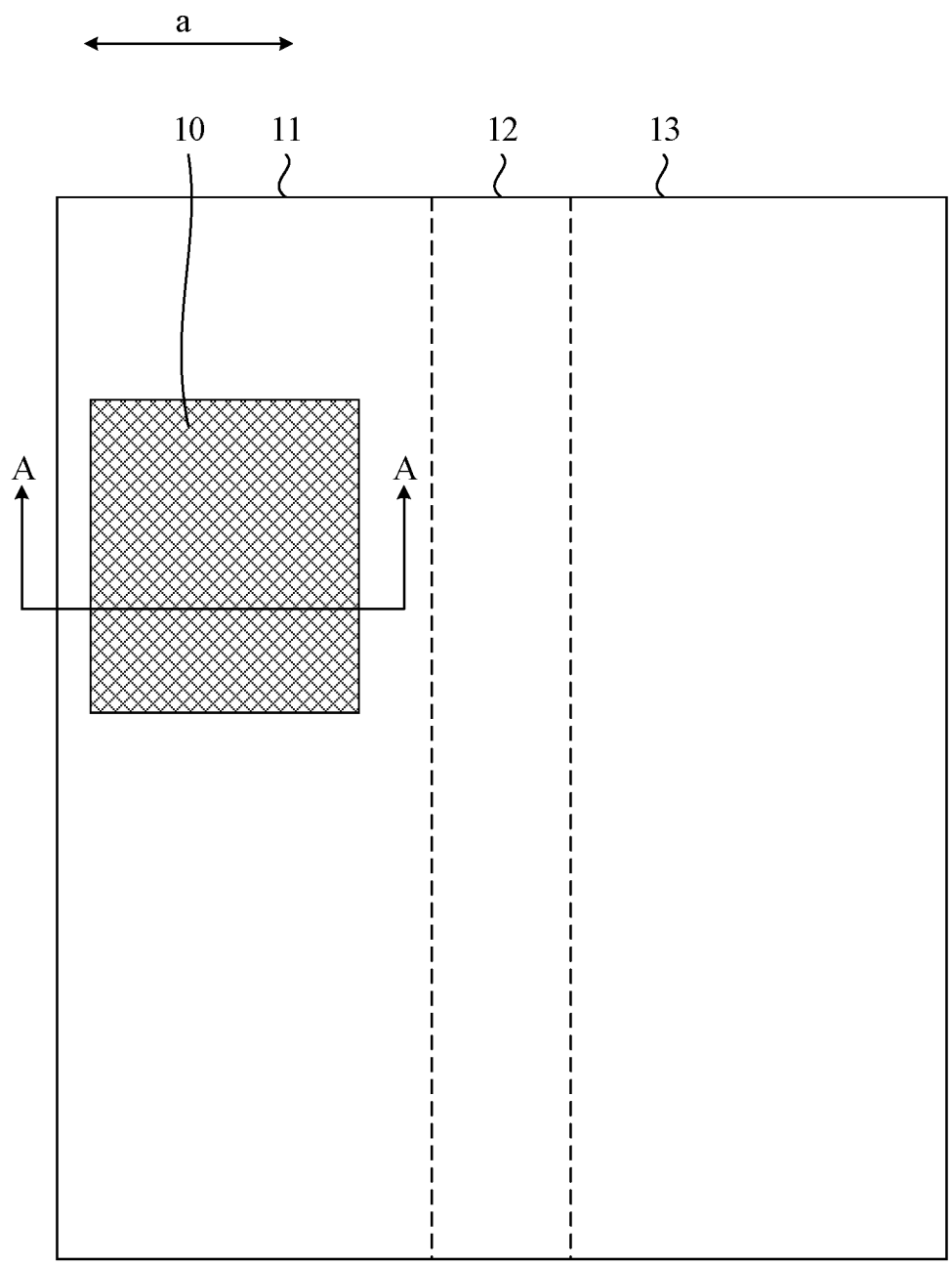
FIG. 1 is a schematic diagram of the position of an NFC antenna module in a foldable display device according to an embodiment of the present disclosure.

FIG. 1 is a schematic diagram of the position of an NFC antenna module in a foldable display device according to an embodiment of the present disclosure. Referring to FIG. 1, the foldable display device includes an NFC antenna module 10. During NFC interaction, the NFC antenna module 10 transmits a signal to interact with a target device. The position and size of the NFC antenna module shown in FIG. 1 are only illustrative. During actual use, NFC antenna modules of different sizes may be selected according to actual needs, or the NFC antenna module is disposed at another position. For example, the NFC antenna module is disposed in the middle of the foldable display device. The foldable display device includes a first planar display region 11, a bendable display region 12, and a second planar display region 13 that are sequentially connected in a first direction a. When the foldable display device is bent at the bendable display region 12, the foldable display device may be changed from a planar state to a bent state.

Figure 2:
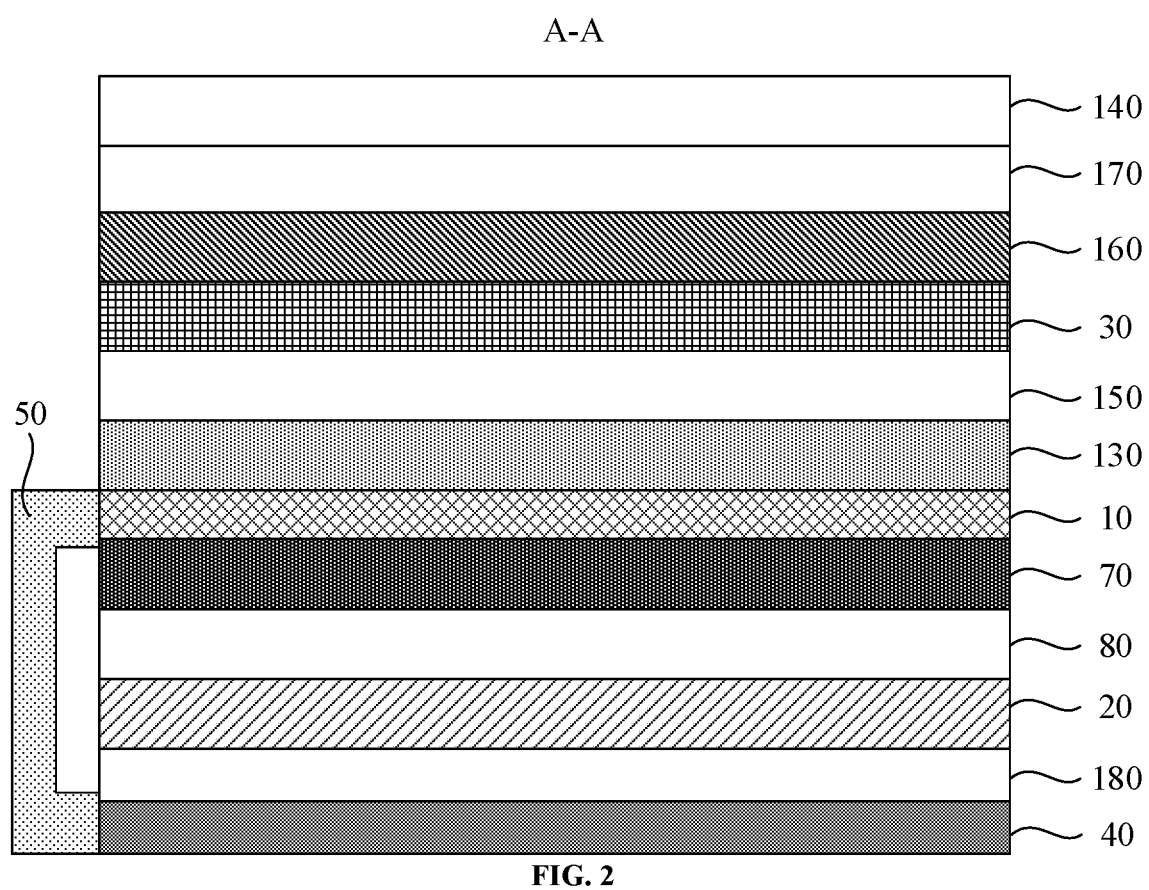
FIG. 2 is a schematic cross-sectional view along a face A-A in FIG. 1.

FIG. 2 is a schematic cross-sectional view along a face A-A in FIG. 1. Referring to FIG. 2, the foldable display device includes the NFC antenna module 10 and a support plate 20, a support back film 130, a display panel 30, and a flexible cover plate 140 that are laminated. The NFC antenna module 10 is disposed between the support plate 20 and the support back film 130. The NFC antenna module 10 is partially overlapped with at least one planar display region of the first planar display region 11 and the second planar display region 13. The NFC antenna module 10 is at least partially not overlapped with the bendable display region 12.

In the embodiments of the present disclosure, the NFC antenna module 10 is disposed between the support plate 20 and the support back film 130. During NFC identification, a screen side of the foldable display device faces a target device that requires interaction. The NFC antenna module 10 transmits a signal to pass through the display panel 30 to interact with the target device, such that NFC identification from the screen side of the foldable display device is achieved.

When the NFC antenna module 10 is partially overlapped with at least one planar display region of the first planar display region 11 and the second planar display region 13, a part of the NFC antenna module 10 is overlapped with a part of the at least one planar display region of the first planar display region 11 and the second planar display region 13, or the NFC antenna module 10 is disposed in the at least one planar display region of the first planar display region 11 and the second planar display region 13.

When the NFC antenna module 10 is at least partially not overlapped with the bendable display region 12, a part of the NFC antenna module 10 is overlapped with a part of the bendable display region 12, or the NFC antenna module 10 is not overlapped with the bendable display region 12. Because the NFC antenna module 10 is at least partially not overlapped with the bendable display region 12, the NFC antenna module 10 is at least partially disposed in the first planar display region 11 or the second planar display region 13. When the foldable display device is bent, the NFC antenna module 10 is partially not bent. Compared with that the NFC antenna module 10 is completely bent, the NFC antenna module 10 can be less prone to damages.

As shown in FIG. 1, the NFC antenna module 10 is disposed in the first planar display region 11, and the NFC antenna module 10 is not overlapped with the bendable display region 12. In this case, when the foldable display device is bent, the NFC antenna module 10 does not need to be bent, such that the NFC antenna module 10 is less prone to damages.

In other embodiments, the NFC antenna module 10 may be disposed in the second planar display region 13.

In other embodiments, a part of the NFC antenna module 10 may be disposed in the bendable display region 12.

The support back film 130 is attached to the display panel 30, such that the support back film 130 protects a rear surface of the display panel 30 and at the same time the support back film 130 supports the display panel 30, such that the display panel 30 is less prone to damages. The flexible cover plate 140 protects a surface of the display panel 30, such that the display panel 30 is less prone to damages.

Referring to FIG. 2 again, the foldable display device further includes a motherboard 40 and an FPC 50. The support plate 20 is disposed between the NFC antenna module 10 and the motherboard 40. That is, the support plate 20 and the NFC antenna module 10 are sequentially disposed on the motherboard 40. The NFC antenna module 10 is electrically connected to the motherboard 40 by the FPC 50.

In the embodiments of the present disclosure, electrical signals need to be transmitted between the foldable display device and the target device. The NFC antenna module 10 is electrically connected to the motherboard 40. During NFC interaction, electrical signals are transmitted between the NFC antenna module 10 and the motherboard 40. The NFC antenna module 10 transmits an electrical signal of the motherboard 40 to the target device in the form of an electromagnetic signal. The target device transmits an electromagnetic signal to the NFC antenna module 10. The NFC antenna module 10 then transmits the electromagnetic signal of the target device to the motherboard 40 in the form of an electrical signal, such that the NFC interaction is achieved between the foldable display device and the target device. The FPC 50 is bendable, and may be bent from a side of the NFC antenna module 10 to a rear surface of the support plate 20 to be electrically connected to the motherboard 40, such that the NFC antenna module 10 and the motherboard 40 are electrically connected.

In some embodiments, a wiring width L1 of the FPC 50 is greater than or equal to a wiring width of the NFC antenna module 10. The wiring width L1 of the FPC 50 is the width of a lead for transmitting an electrical signal in the FPC 50. The wiring width of the NFC antenna module 10 is the width of a single antenna in the NFC antenna module 10.

In the embodiments of the present disclosure, when the foldable display device and the target device perform NFC interaction, the NFC antenna module 10 generates an electromagnetic field (that is, the electromagnetic signal). The electromagnetic field needs to pass through the display panel 30 to be transmitted to the target device. The electromagnetic field is subject to partial loss during transmission. When a magnetic field generated in the NFC antenna module 10 has a higher strength, the electromagnetic signal received by the target device is stronger. The NFC antenna module 10 includes a coil. A quantity of turns of the coil is positively correlated to the strength of the magnetic field of the NFC antenna module 10. When the quantity of turns of the coil is larger, the strength of the magnetic field of the NFC antenna module 10 is higher. The coil in the NFC antenna module 10 is spiral and is disposed in the same plane. The NFC antenna module 10 and the support plate 20 are attached, to reduce the wiring width of the NFC antenna module 10. In the case that a coil area and a wiring distance are fixed, the quantity of turns of the coil in the NFC antenna module 10 may be increased to increase the strength of the magnetic field of the NFC antenna module 10. In this case, the electromagnetic signal received by the target device is stronger, such that the effectiveness of signal transmission is ensured. In addition, the wiring width of the FPC 50 is increased, such that the resistance of the FPC 50 is reduced, thereby reducing the load of the FPC 50.

In the embodiments of the present disclosure, the wiring width L1 of the FPC 50 ranges from 2 mm to 5 mm.

The FPC 50 is bent from a side of the NFC antenna module 10 to the rear surface of the support plate 20 to be electrically connected to the motherboard 40. Therefore, if the FPC 50 is excessively wide, the FPC 50 occupies relatively large space on the side of the NFC antenna module 10, affecting a volume of the foldable display device. It is defined that the range of the wiring width of the FPC 50 is 2 mm to 5 mm, such that the resistance of the FPC 50 is reduced to reduce the load of the FPC 50, and the wiring width of the FPC 50 is prevented from becoming excessively large and the volume of the foldable display device is not affected.

In the embodiments of the present disclosure, the FPC 50 may be bonded and connected to the NFC antenna module 10 and the motherboard 40 by anisotropic conductive films (ACF).

Figure 3:
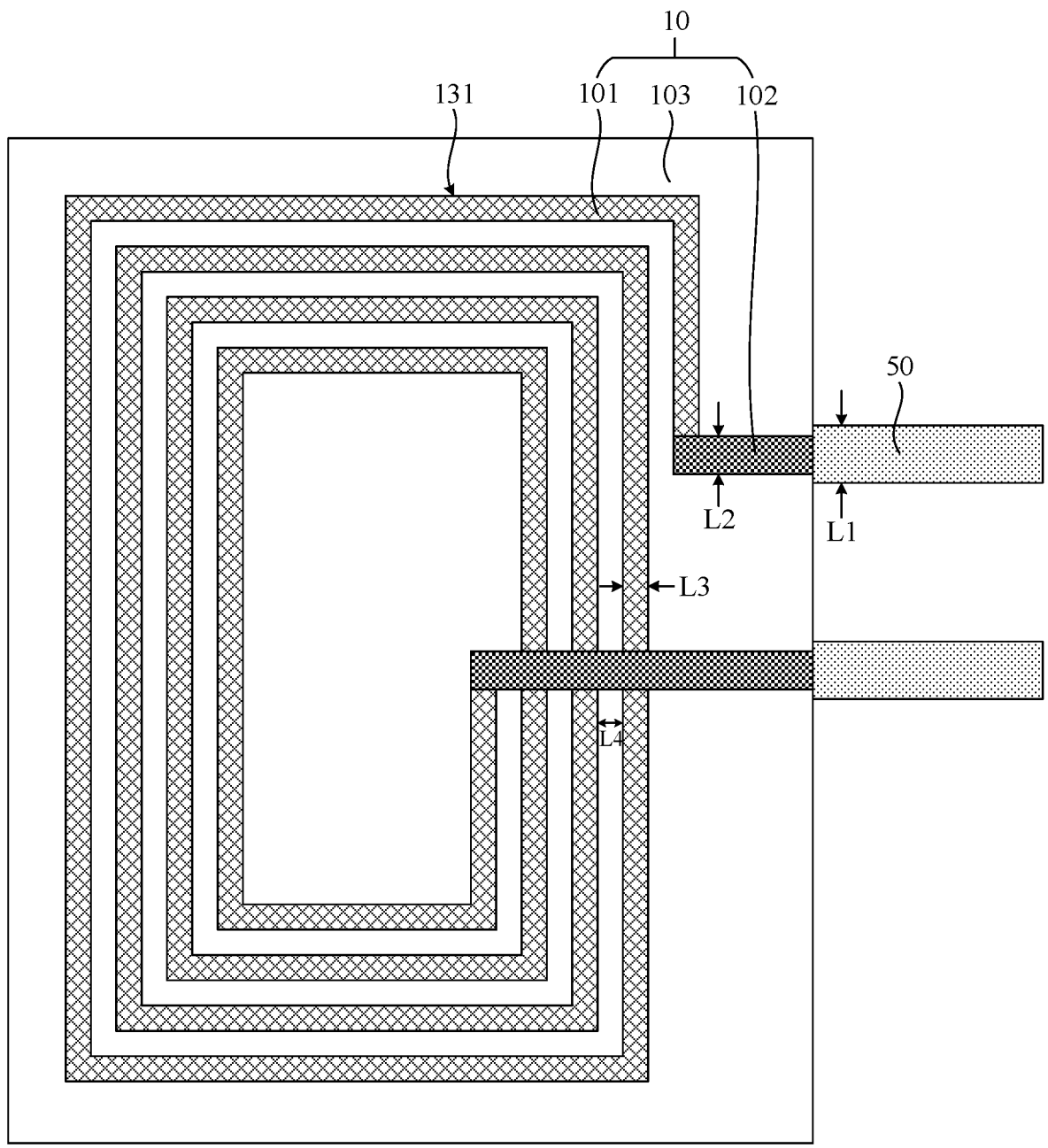
FIG. 3 is a top view of an NFC antenna module being electrically connected to an FPC according to an embodiment of the present disclosure.

FIG. 3 is a top view of an NFC antenna module being electrically connected to an FPC according to an embodiment of the present disclosure. Referring to FIG. 3, the NFC antenna module 10 includes an antenna coil 101 and an antenna feeder line 102. The antenna feeder line 102 is electrically connected to the antenna coil 101. A wiring width L2 of the antenna feeder line 102 is greater than a wiring width L3 of the antenna coil 101. The antenna feeder line 102 is electrically connected to the FPC 50. The wiring width L2 of the antenna feeder line 102 represents the width of the antenna feeder line 102. The wiring width L3 of the antenna coil 101 represents the width of a single antenna.

In the embodiments of the present disclosure, the antenna coil 101 is spiral. The antenna coil 101 generates an electromagnetic wave to implement signal transmission with the target device. The antenna feeder line 102 is electrically connected to the FPC 50 and the antenna coil 101. The wiring width L2 of the antenna feeder line 102 is increased, such that compared with the antenna coil 101, the antenna feeder line 102 has a smaller resistance, and the antenna feeder line 102 has a lighter load.

In some embodiments, the wiring width L3 of the antenna coil 101 ranges from 0.1 mm to 2 mm.

In the embodiments of the present disclosure, it is defined that the wiring width L3 of the antenna coil 101 ranges from 0.1 mm to 2 mm, such that a quantity of turns of the coil of the antenna coil 101 is ensured, and the wiring width of the antenna coil 101 is prevented from becoming excessively small. In this way, the load of the antenna coil 101 is not caused to increase by an excessively large resistance of the antenna coil 101.

In some embodiments, the wiring width L2 of the antenna feeder line 102 ranges from 0.5 mm to 5 mm.

In the embodiments of the present disclosure, it is defined that the wiring width L2 of the antenna feeder line 102 ranges from 0.5 mm to 5 mm, such that the resistance of the antenna feeder line 102 is reduced and the load of the antenna feeder line 102 is reduced, and the wiring width L2 of the antenna feeder line 102 is prevented from becoming excessively large, In this way, the space occupied by the antenna coil 101 is not caused to increase by a relatively large space occupied by the antenna feeder line 102.

In the embodiments of the present disclosure, the wiring width L2 of the antenna feeder line 102 may be equal to the wiring width of the FPC 50.

In some embodiments, the antenna coil 101 is a Cu coil. Cu has relatively low resistance and is inexpensive. While the resistance of the antenna coil 101 is reduced and the relative magnetic permeability of the antenna coil 101 is increased, the costs of manufacturing the foldable display device can be further reduced.

Optionally, in other embodiments, the antenna coil 101 is an Ag coil or an Al coil.

In the embodiments of the present disclosure, a wiring distance L4 of the antenna coil 101 ranges from 0.1 mm to 1 mm. In the case that the quantity of turns of the antenna coil 101 is ensured, the wiring distance L4 of the antenna coil 101 is prevented from becoming excessively small, such that adjacent coils is prevented from being misconnected and normal operation of the antenna coil 101 is not affected. The wiring distance L4 of the antenna coil 101 represents a minimum distance between two adjacent antennas.

In the embodiments of the present disclosure, the inductance of the antenna coil 101 is greater than 0.3 µH.

When the inductance of the antenna coil 101 is larger, the antenna coil 101 has a better filtering effect, such that interfering electromagnetic waves are filtered out and incorrect signal transmission is avoided.

In the embodiments of the present disclosure, the relative magnetic permeability of the antenna coil 101 is greater than 150, and the magnetic loss of the antenna coil 101 less than 100. The real part of magnetic permeability is the relative magnetic permeability, and the imaginary part of the magnetic permeability is the magnetic loss. The magnetic loss is also referred to as an imaginary part magnetic loss relative value of the magnetic permeability.

In the embodiments of the present disclosure, an electromagnetic signal generated by the antenna coil 101 is subject to a loss during transmission. It is defined that the relative magnetic permeability of the antenna coil 101 is greater than 150 and the magnetic loss is less than 100, such that the target device receives the electromagnetic signal transmitted by the antenna coil 101 to achieve NFC interaction.

In the embodiments of the present disclosure, the quantity of turns of the antenna coil 101 is greater than or equal to 2, and an area of the antenna coil 101 is greater than or equal to 1000 mm$^2$, such that the antenna coil 101 generates an effective electromagnetic signal.

In FIG. 3, the antenna coil 101 has a shape of a rectangular ring. Optionally, in other embodiments, the antenna coil 101 has a shape of a circular ring, an elliptical ring, or another regular or irregular ring structure.

In FIG. 2, the NFC antenna module 10 is electrically connected to the motherboard 40 by the FPC 50, and a bonding manner of the ACF is relatively simple, such that manufacturing steps are simplified. However, the FPC 50 needs to be bent from a side of the NFC antenna module 10 to reach the motherboard 40 to be electrically connected to the motherboard 40. As a result, the volume of the foldable display device is increased.

In other embodiments, the NFC antenna module 10 may be electrically connected to the motherboard 40 by another structure.

Figure 4:
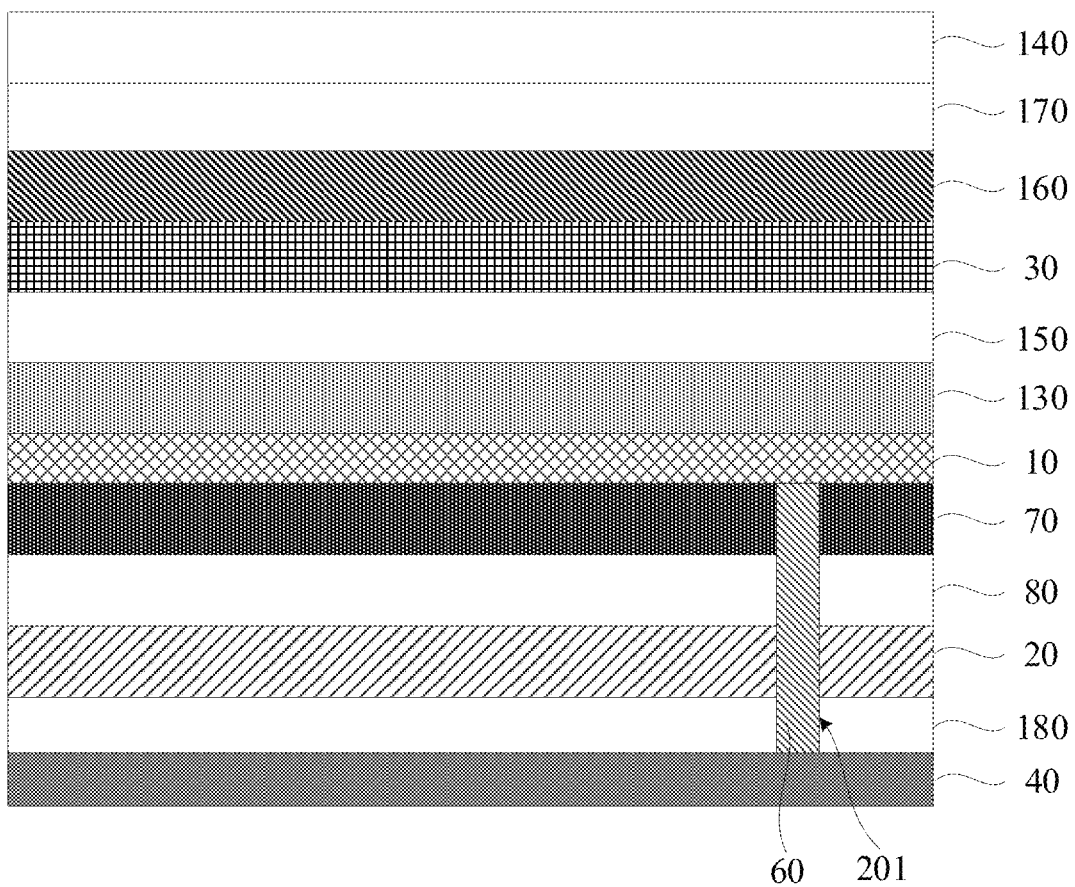
FIG. 4 is a diagram of film layers of a foldable display device according to an embodiment of the present disclosure.

FIG. 4 is a diagram of film layers of a foldable display device according to an embodiment of the present disclosure. Referring to FIG. 4, the foldable display device further includes a motherboard 40 and a conductive structure 60. The support plate 20 is disposed between the NFC antenna module 10 and the motherboard 40. A through hole 201 is provided in the support plate 20. The conductive structure 60 is disposed in the through hole 201. The NFC antenna module 10 is electrically connected to the motherboard 40 by the conductive structure 60.

In the embodiment shown in FIG. 4, the through hole 201 is disposed in the support plate 20. The conductive structure 60 is disposed in the through hole 201. The NFC antenna module 10 is electrically connected to the motherboard 40 by the conductive structure 60. In this way, the conductive structure 60 may be disposed in the NFC antenna module 10, and it is not necessary to arrange an FPC 50 on an outer side of the NFC antenna module 10, such that the volume of the foldable display device is reduced.

In some embodiments, the conductive structure 60 is a conductive adhesive. The conductive adhesive is directly injected into the through hole 201 to form the conductive structure 60, such that the manufacturing process is simplified.

Optionally, the conductive structure 60 is a metal elastic sheet or the conductive structure 60 is a lead. Both the metal elastic sheet and the lead can implement an electrical connection between the NFC antenna module 10 and the motherboard 40.

In some embodiments, the conductive structure 60 is soldered to the motherboard 40, such that the conductive structure 60 and the motherboard 40 are securely electrically connected.

Optionally, the conductive structure 60 and the motherboard 40 are connected by a crimping adhesive, such that the conductive structure 60 and the motherboard 40 are electrically connected more conveniently without soldering.

Figure 5:
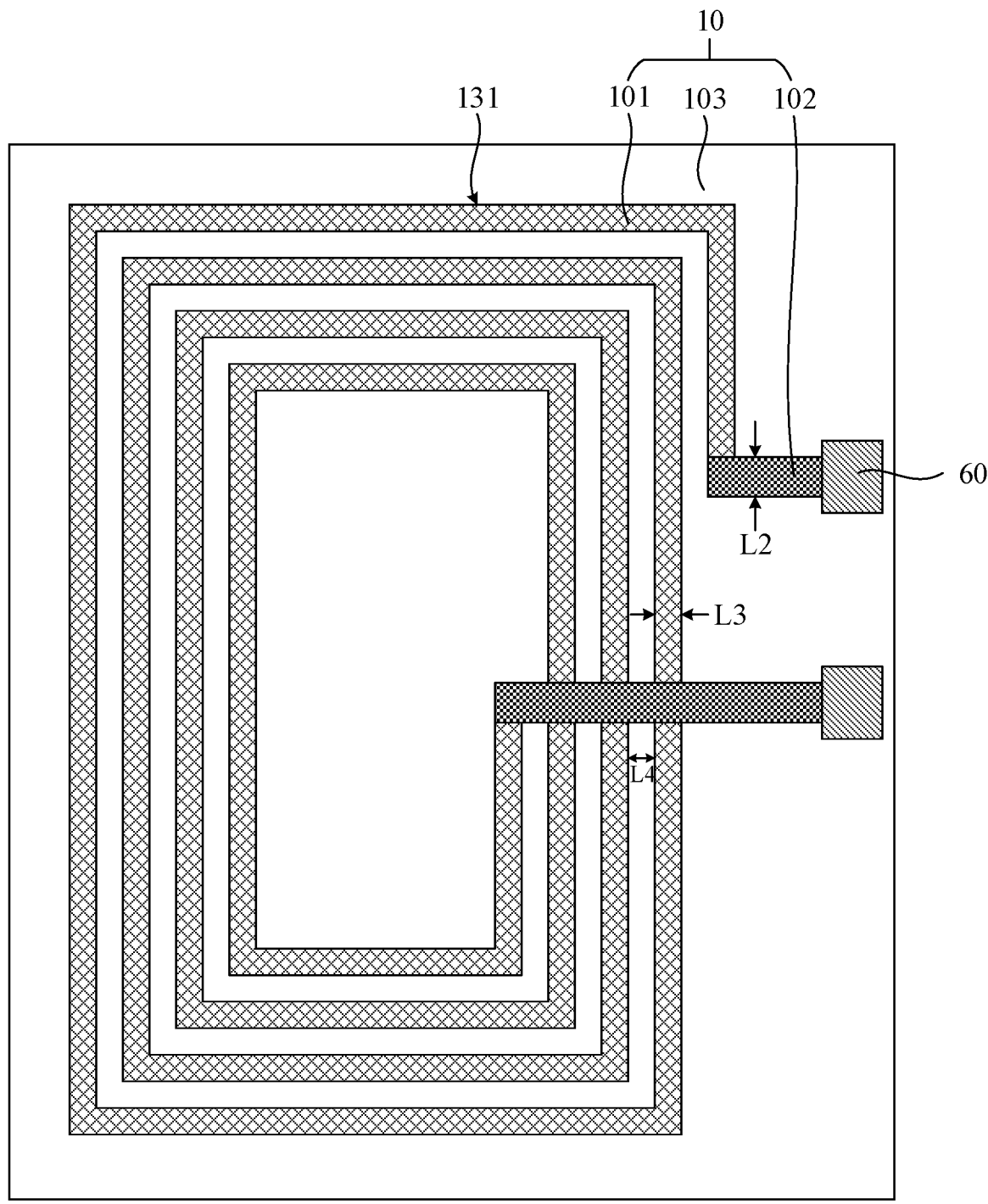
FIG. 5 is a top view of an NFC antenna module being electrically connected to a conductive structure according to an embodiment of the present disclosure.

FIG. 5 is a top view of an NFC antenna module being electrically connected to a conductive structure according to an embodiment of the present disclosure. Referring to FIG. 5, an antenna feeder line 102 is electrically connected to the conductive structure 60. An antenna coil 101 is electrically connected to the conductive structure 60 by the antenna feeder line 102.

Referring to FIG. 3 and FIG. 5, the NFC antenna module 10 further includes an antenna base 103. A groove 131 is provided in the antenna base 103. The shape of the groove 131 is consistent with the shape of the antenna coil 101. The antenna coil 101 is disposed in the groove 131. During manufacturing of the NFC antenna module 10, one surface of the antenna base 103 is half etched to form the groove 131. Next, the antenna coil 101 is formed in the groove 131. A laser drilling process or another drilling process is performed in the other surface of the antenna base 103 at a relative position of an end portion of the antenna coil 101 to form the through hole. Next, feeder line metal is deposited or a metal conductor is filled in the through hole to form a via. The antenna feeder line 102 is then formed in the other surface of the antenna base 103, to allow the antenna feeder line 102 to be electrically connected to the antenna coil 101 by the via.

In the embodiments of the present disclosure, the antenna coil 101 and the antenna feeder line 102 are disposed in two opposite surfaces of the antenna base 103. In FIG. 3 and FIG. 5, to clearly show a connection relationship between the antenna coil 101 and the antenna feeder line 102, the antenna coil 101 and the antenna feeder line 102 are drawn in the same surface of the antenna base 103, such that one antenna feeder line 102 is electrically connected to a plurality of antenna loops of the antenna coil 101. In practice, the antenna feeder line 102 is only connected to the end portion of the antenna coil 101.

Optionally, in other embodiments, after the antenna coil 101 is formed in the antenna base 103, one insulating layer covers the antenna coil 101. Then the through hole is formed in the insulating layer at the relative position of the end portion of the antenna coil 101. Next, feeder line metal is deposited or a metal conductor is filled in the through hole. The antenna feeder line 102 is formed on the insulating layer, such that the antenna feeder line 102 is electrically connected to the antenna coil 101 by the via.

Optionally, in other embodiments, the antenna coil 101 may be formed on the antenna base 103 through printing, and next, the antenna feeder line 102 is formed by using the foregoing method.

In the embodiments of the present disclosure, the antenna base 103 may be a polyester resin (polyethylene terephthalate, PET) base or a polyimide (PI) base.

In the embodiments of the present disclosure, the insulating layer may be an insulating adhesive layer or a PI layer. In the case that the insulating layer ensures insulation between adjacent coils, the planarization of a surface of the NFC antenna module 10 can be further improved.

In the embodiments of the present disclosure, the support plate 20 supports the display panel 30. The support plate 20 is a metal support plate, such that the support performance of the support plate 20 is ensured. In addition, metal has better heat dissipation and thus heat dissipation is achieved on the display panel 30, such that the temperature of the display panel 30 is prevented from becoming excessively high, and damages to the display panel 30 are avoided.

For example, the support plate 20 may be a stainless steel sheet or a Cu foil.

Referring to FIG. 2 and FIG. 4 again, the foldable display device further includes a magnetic conductive layer 70, disposed between the support plate 20 and the NFC antenna module 10.

In the embodiments of the present disclosure, because the support plate 20 is a metal support plate, a magnetic field generated by the NFC antenna module 10 is radiated to the metal support plate to generate an eddy current effect to cause disorderly magnetic field lines, an increased magnetic field loss, and heat generation in the metal support plate, which adversely affects the performance of the NFC antenna module 10. The magnetic conductive layer 70 is disposed between the support plate 20 and the NFC antenna module 10. The magnetic conductive layer 70 may block electromagnetic waves, such that an electromagnetic field is prevented from being radiated to the metal support plate and the eddy current effect is avoided. In this way, an eddy current is eliminated, and the impact of the eddy current effect on the NFC antenna module 10 is avoided.

For example, the material of the magnetic conductive layer 70 is at least one of ferrite, noncrystal, or ferrous nanocrystal. The ferrite, noncrystal, and ferrous nanocrystal are all capable of blocking electromagnetic waves, thereby ensuring the performance of blocking electromagnetic waves of the magnetic conductive layer 70.

In the embodiments of the present disclosure, the NFC antenna module 10 and the magnetic conductive layer 70 may be bonded by an adhesive material layer. For example, the adhesive material layer is an optical adhesive layer, a foam adhesive layer, or an acrylic adhesive layer.

Referring to FIG. 2 and FIG. 4 again, the foldable display device further includes a first adhesive material layer 80. The first adhesive material layer 80 is bonded between the magnetic conductive layer 70 and the support plate 20. The first adhesive material layer 80 bonds the magnetic conductive layer 70 and the support plate 20 together, such that the fixedness of the magnetic conductive layer 70 is ensured.

For example, the first adhesive material layer 80 is an optical adhesive layer, a foam adhesive layer, or an acrylic adhesive layer.

Referring to FIG. 2 and FIG. 4 again, the through hole 201 further extends through the first adhesive material layer 80 and the magnetic conductive layer 70, such that the NFC antenna module 10 and the motherboard 40 are electrically connected.

Referring to FIG. 2 and FIG. 4 again, the support back film 130 and the NFC antenna module 10 are both disposed on a non-light emitting side of the display panel 30, such that the NFC antenna module 10 is prevented from affecting the display effect of the foldable display device.

For example, the support back film 130 may be a polyethylene (PE) film or a PI film.

Referring to FIG. 2 and FIG. 4 again, a back film adhesive layer 150 is provided between the display panel 30 and the support back film 130. The display panel 30 and the support back film 130 are bonded by the back film adhesive layer 150.

For example, the back film adhesive layer 150 may be an optical adhesive layer, a foam adhesive layer, or an acrylic adhesive layer.

For example, the flexible cover plate 140 may be an ultrathin glass cover plate, such that the transparency and flexibility of the flexible cover plate 140 are ensured.

In other embodiments, the flexible cover plate 140 may be a polyester resin cover plate, a PI cover plate, a stacked polyester resin cover plate or a stacked PI cover plate.

Referring to FIG. 2 and FIG. 4 again, the foldable display device further includes a functional module layer 160. The functional module layer 160 is disposed between the flexible cover plate 140 and the display panel 30. The functional module layer 160 includes an optical film (for example, a polarizer), a touch module, and the like, such that that the foldable display device normally displays a picture and implement a touch function.

Referring to FIG. 2 and FIG. 4 again, a modular adhesive layer 170 is provided between the functional module layer 160 and the flexible cover plate 140. The functional module layer 160 and the flexible cover plate 140 are bonded by the modular adhesive layer 170.

For example, the modular adhesive layer 170 may be an optical adhesive layer, a foam adhesive layer, or an acrylic adhesive layer.

In the embodiments of the present disclosure, the display panel 30 is a flexible organic light-emitting diode (OLED) display panel or a quantum dot (QD) display panel. The support plate 20 is a flexible support plate, such that the bending performance of the foldable display device is achieved.

Figure 6:
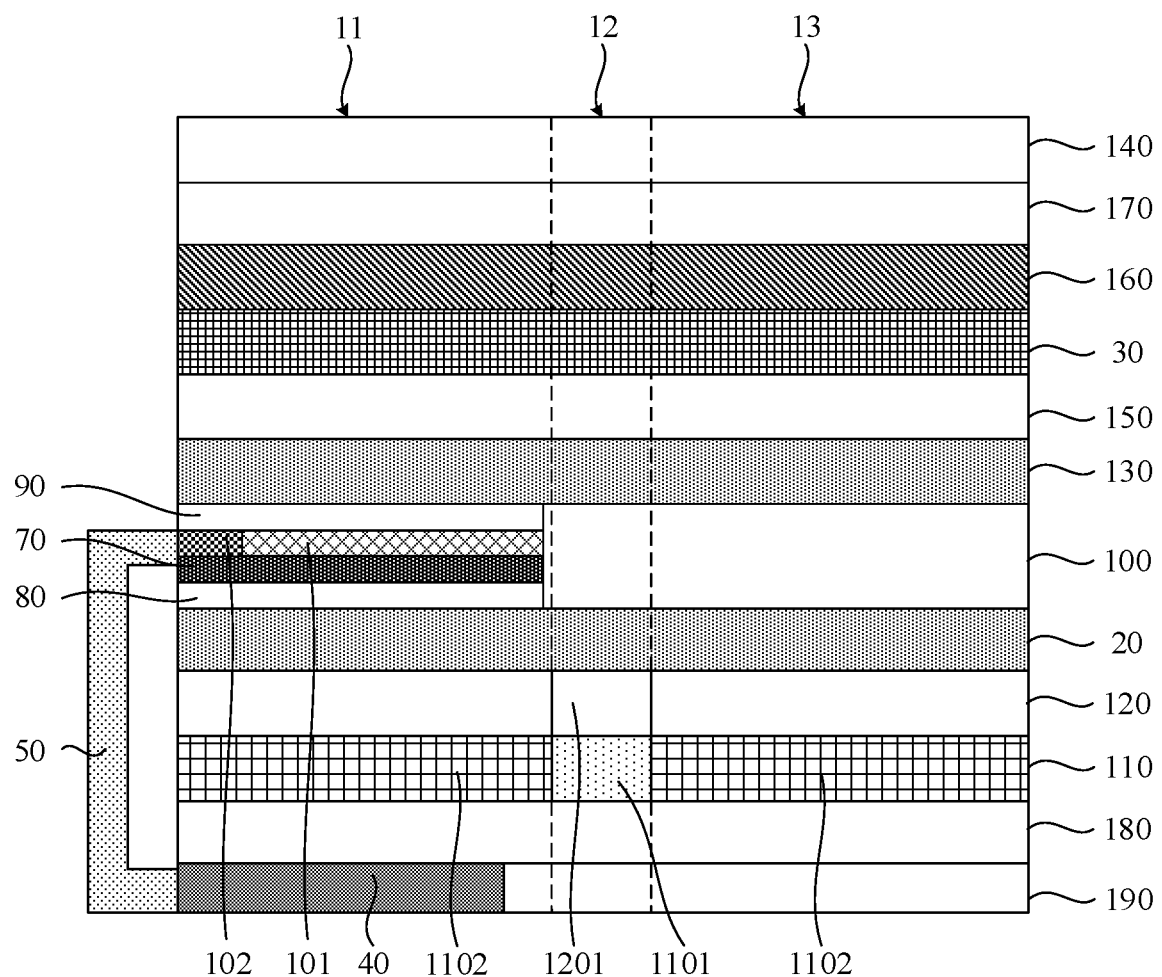
FIG. 6 is a diagram of film layers of another foldable display device according to an embodiment of the present disclosure.

FIG. 6 is a diagram of film layers of another foldable display device according to an embodiment of the present disclosure. Referring to FIG. 1 and FIG. 6, the foldable display device includes one NFC antenna module 10. The one NFC antenna module 10 is disposed in the one planar display region of a first planar display region 11 and a second planar display region 13. In the foldable display device shown in FIG. 1 and FIG. 6, the NFC antenna module 10 is disposed in the first planar display region 11. In other embodiments, the NFC antenna module 10 may be disposed in the second planar display region 13. The foldable display device includes one NFC antenna module 10. The foldable display device has a simpler structure. In this case, the foldable display device includes one motherboard 40. The one motherboard 40 and the one NFC antenna module 10 are disposed in the same planar display region. In one aspect, an electrical connection between the NFC antenna module 10 and the motherboard 40 is facilitated. In addition, the motherboard 40 does not pass through a bendable display region 12. The motherboard 40 is prevented from damages due to bending. Because the motherboard 40 is only disposed in one planar display region, there is a step at the motherboard 40. A filling layer 190 is disposed in the layer in which the motherboard 40 is disposed to fill the step such that the levelness of the foldable display device is ensured.

For example, the filling layer 190 is filling foam.

The bendable foldable display device according to the embodiments of the present disclosure is an outward bendable foldable display device. That is, after bending, the flexible cover plate 140 is disposed on an outer side of the bending. In this case, where NFC interaction is required, a screen side on which the first planar display region 11 is disposed faces a target device, such that the NFC interaction is achieved between the foldable display device and the target device.

Figure 7:
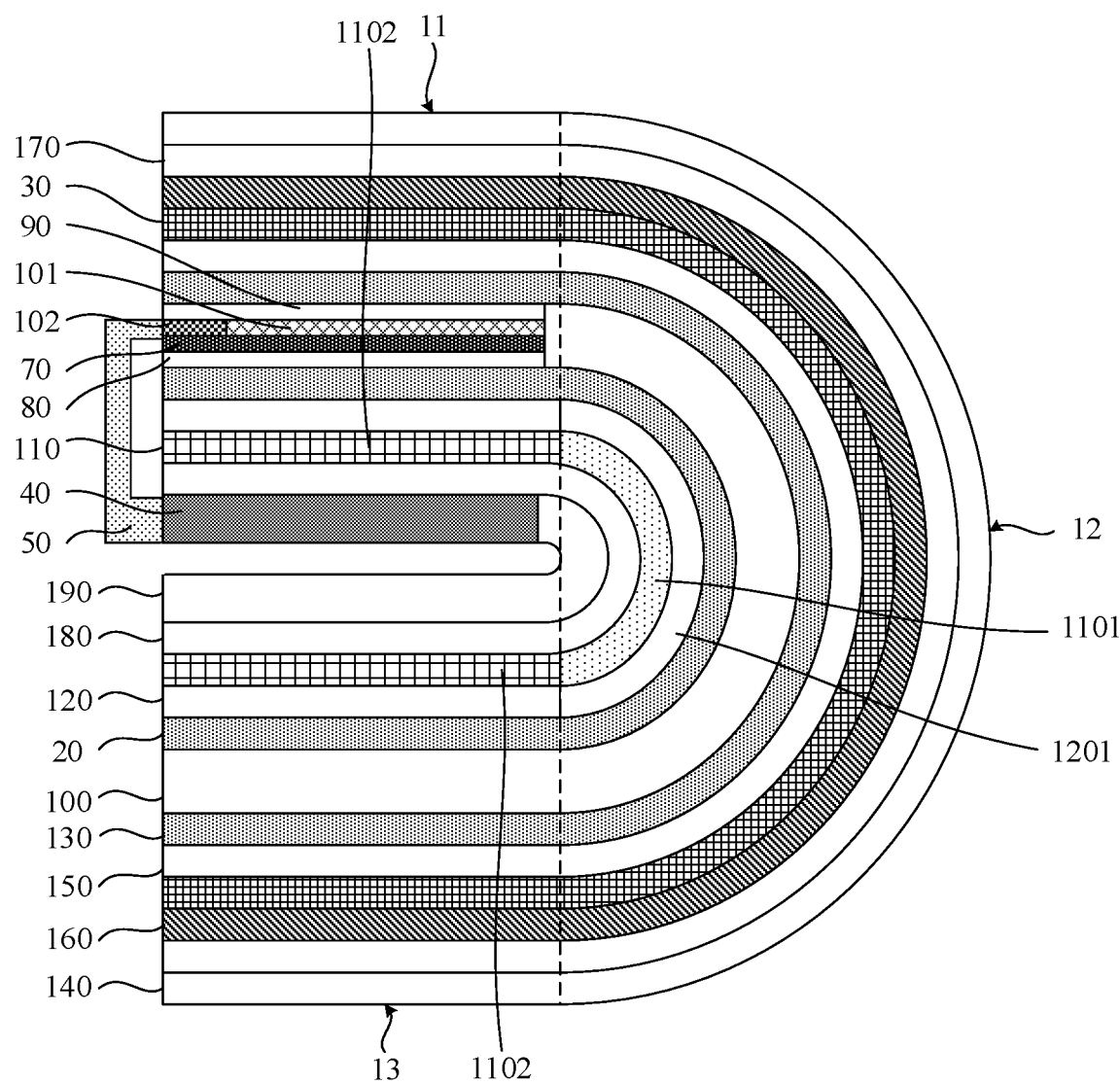
FIG. 7 is a schematic diagram of film layers after the foldable display device shown in FIG. 6 is bent.

FIG. 7 is a schematic diagram of film layers after the foldable display device shown in FIG. 6 is bent. Referring to FIG. 7, during NFC interaction, in the case that a screen side on which the second planar display region 13 is disposed faces the target device, the foldable display device is turned over, such that the screen side on which the first planar display region 11 is disposed face the target device, and hence the NFC interaction between the foldable display device and the target device is achieved. Compared with the related art in which the foldable display device needs to be switched to a planar state, such that the NFC interaction is achieved between the foldable display device and the target device, thereby simplifying operations.

Figure 8:
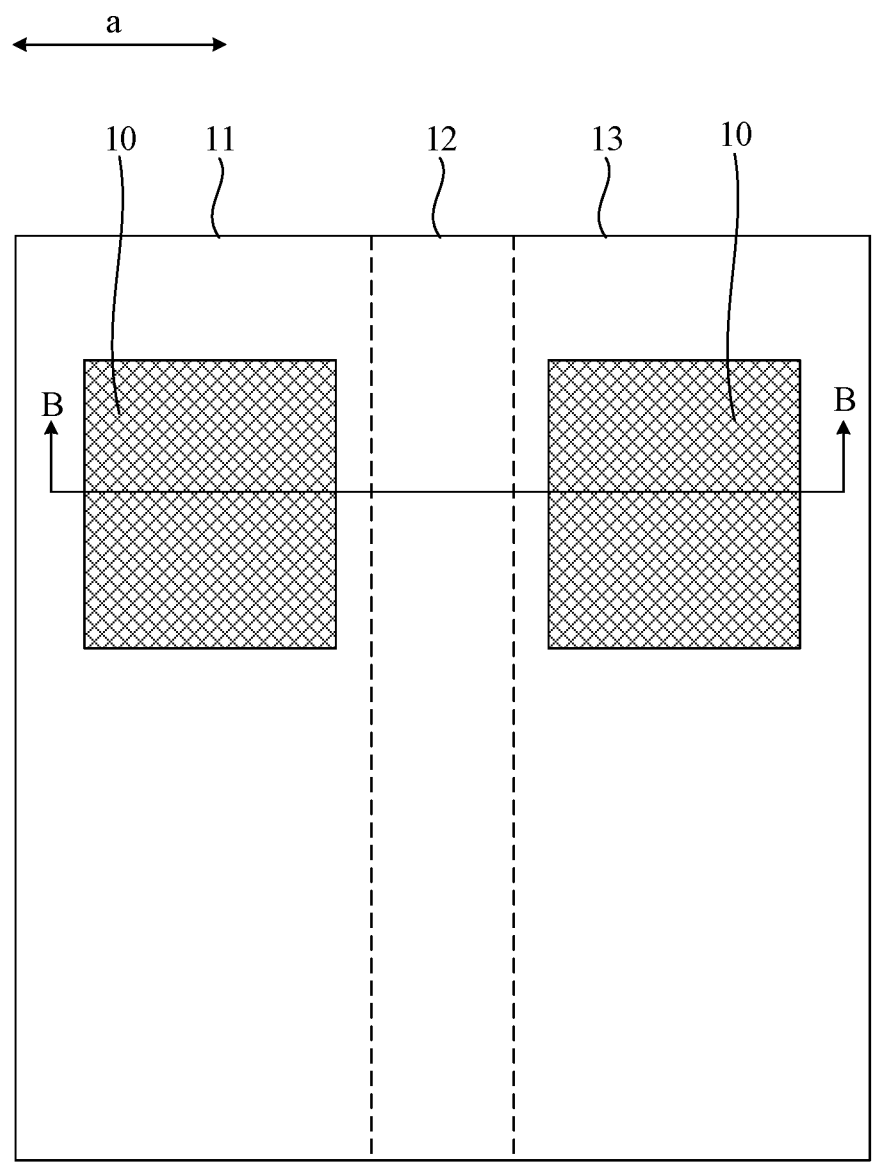
FIG. 8 is a schematic diagram of the position of an NFC antenna module in another foldable display device according to an embodiment of the present disclosure.
Figure 9:
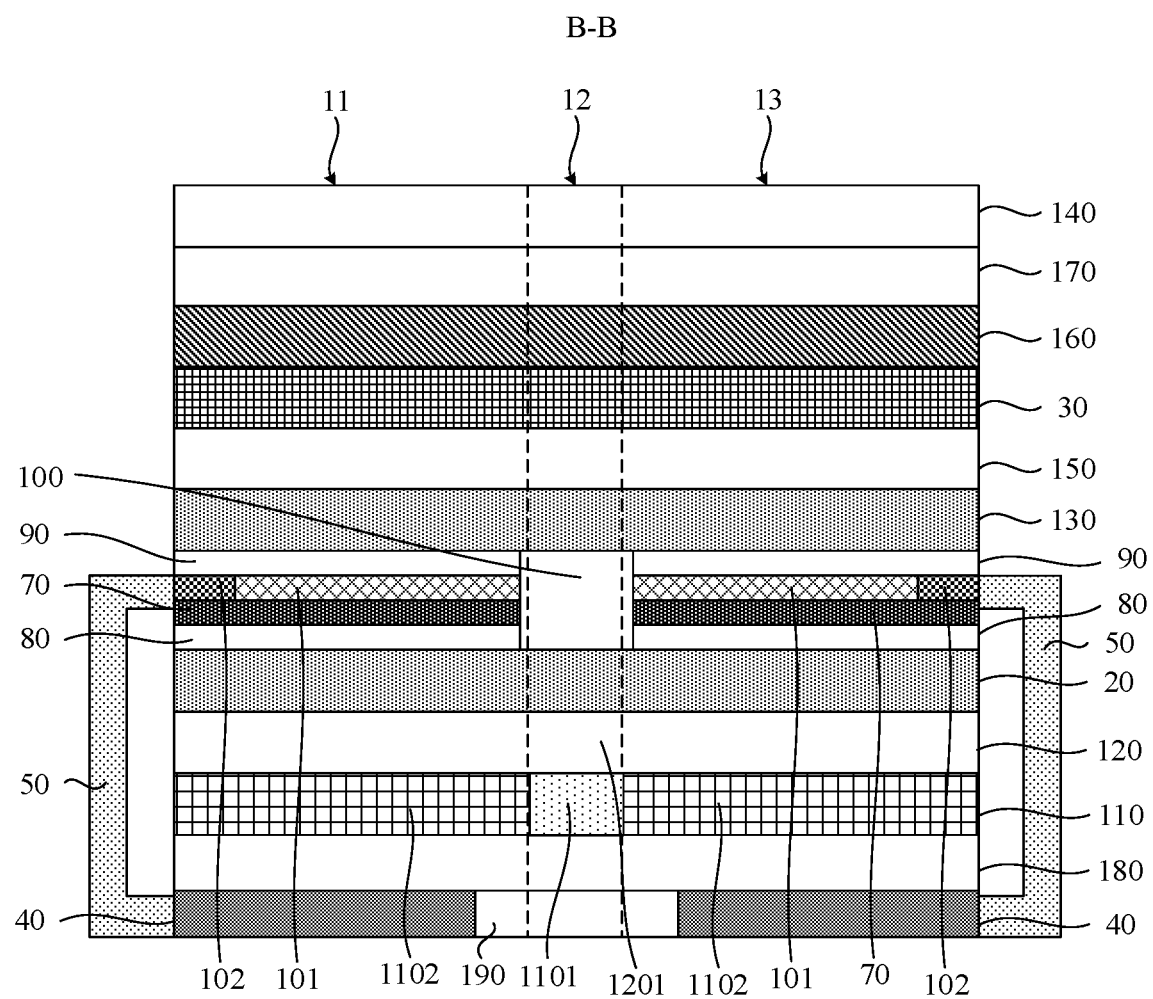
FIG. 9 is a schematic cross-sectional view along a face B-B in FIG. 8.

FIG. 8 is a schematic diagram of the position of an NFC antenna module in another foldable display device according to an embodiment of the present disclosure. Referring to FIG. 8, the foldable display device includes two NFC antenna modules 10. FIG. 9 is a schematic cross-sectional view along a face B-B in FIG. 8. Referring to FIG. 8 and FIG. 9, the two NFC antenna modules 10 are respectively disposed in a first planar display region 11 and a second planar display region 13. In this case, the foldable display device includes two motherboards 40. The two motherboards 40 are respectively electrically connected to the two NFC antenna modules 10. The motherboards 40 and the electrically connected NFC antenna modules 10 are disposed in the same planar display region. The filling layer 190 is disposed between the two motherboards 40 to fill the step.

Figure 10:
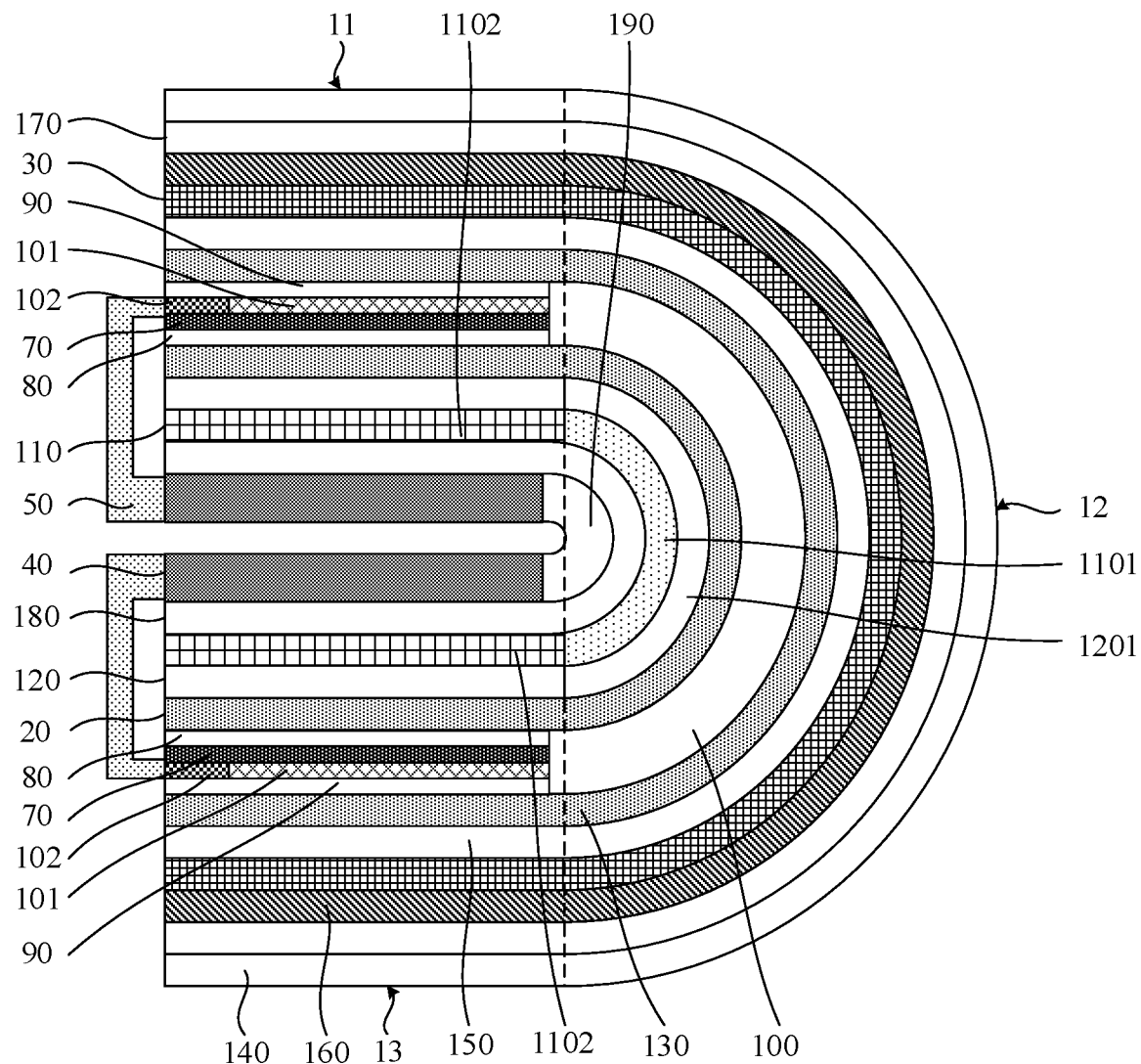
FIG. 10 is a schematic diagram of film layers after the foldable display device shown in FIG. 8 is bent.

FIG. 10 is a schematic diagram of film layers after the foldable display device shown in FIG. 8 is bent. Referring to FIG. 10, when the foldable display device is in a bent state, the first planar display region 11 and the second planar display region 13 are opposite to each other, and a screen side on which the first planar display region 11 is disposed and a screen side on which the second planar display region 13 is disposed are both outer sides of bending. During NFC interaction, from both the screen side on which the first planar display region 11 is disposed and the screen side on which the second planar display region 13 is disposed, the NFC interaction between the foldable display device and a target device can be implemented, making operations simpler.

As shown in FIG. 6, FIG. 7, FIG. 9, and FIG. 10, the NFC antenna module 10 is not disposed in the bendable display region 12 of the foldable display device, such that the NFC antenna module 10 is prevented from damages during bending.

In other embodiments, a part of the NFC antenna module 10 is disposed in the bendable display region 12.

Referring to FIG. 6, FIG. 7, FIG. 9, and FIG. 10 again, the foldable display device further includes a second adhesive material layer 90 and a third adhesive material layer 100. The second adhesive material layer 90 is bonded between the NFC antenna module 10 and the support back film 130. The third adhesive material layer 100 is bonded between the support plate 20 and the support back film 130. A surface of the third adhesive material layer 100 opposite to the support plate 20 is attached to the support plate 20. A surface of the first adhesive material layer 80 opposite to the support plate 20 is attached to the support plate 20.

In the embodiments of the present disclosure, the second adhesive material layer 90 bonds the NFC antenna module 10 and the display panel 30 together, such that the stability of the NFC antenna module 10 is ensured.

The NFC antenna module 10 is not disposed in the bendable display region 12 of the foldable display device, and a step is formed between the bendable display region 12 and the first planar display region 11 or the second planar display region 13, which affects the planarization of a surface of the foldable display device. The third adhesive material layer 100 is disposed to fill the step between the first adhesive material layer 80 and the second adhesive material layer 90, such that the planarization of the surface of the foldable display device is ensured.

For the foldable display device shown in FIG. 6 and FIG. 7, the third adhesive material layer 100 is bonded in the first planar display region 11, in the bendable display region 12, and at an edge of a boundary between the second planar display region 13 and the bendable display region 12. For the foldable display device shown in FIG. 8 to FIG. 10, the third adhesive material layer 100 is bonded at an edge of a boundary between the first planar display region 11 and the bendable display region 12, in the bendable display region 12, and at an edge of the boundary between the second planar display region 13 and the bendable display region 12.

In the embodiments of the present disclosure, a difference between the thickness of the third adhesive material layer 100 and a sum of the thickness of the first adhesive material layer 80, the thickness of the magnetic conductive layer 70, the thickness of the NFC antenna module 10, and the thickness of the second adhesive material layer 90 is less than 10 μm.

It is defined that the difference between the thickness of the third adhesive material layer 100 and the sum of the thickness of the first adhesive material layer 80, the thickness of the magnetic conductive layer 70, the thickness of the NFC antenna module 10, and the thickness of the second adhesive material layer 90 is less than 10 μm, such that a step filling effect of the third adhesive material layer 100 is achieved.

In the embodiments of the present disclosure, the thickness of the first adhesive material layer 80 ranges from 15 μm to 50 μm.

In the embodiments of the present disclosure, the thickness of the magnetic conductive layer 70 ranges from 15 μm to 50 μm.

In the embodiments of the present disclosure, the thickness of the NFC antenna module 10 ranges from 1 μm to 35 μm.

In the embodiments of the present disclosure, the thickness of the second adhesive material layer 90 is 15 μm to 50 μm.

The thickness of the first adhesive material layer 80, the thickness of the magnetic conductive layer 70, the thickness of the NFC antenna module 10, and the thickness of the second adhesive material layer 90 are limited, such that the thickness of the foldable display device is prevented from increasing while the performance of the first adhesive material layer 80, the magnetic conductive layer 70, the NFC antenna module 10, and the second adhesive material layer 90 is ensured.

For example, the second adhesive material layer 90 is an optical adhesive layer, a foam adhesive layer, or an acrylic adhesive layer.

For example, the third adhesive material layer 100 is an optical adhesive layer, a foam adhesive layer, or an acrylic adhesive layer.

Because the support plate 20 is a flexible support plate, the supporting performance of the support plate 20 is reduced, such that another support structure is disposed in the foldable display device to support the display panel 30.

Referring to FIG. 6, FIG. 7, FIG. 9, and FIG. 10 again, the foldable display device further includes a support structure 110 and a fourth adhesive material layer 120. The fourth adhesive material layer 120 is bonded between the support structure 110 and the support plate 20.

In the embodiments of the present disclosure, the support structure 110 is disposed to improve the supporting effect of the display panel 30, and in addition the fourth adhesive material layer 120 bonds the support structure 110 and the support plate 20 together, such that the stability of the support structure 110 is ensured.

Referring to FIG. 6, FIG. 7, FIG. 9, and FIG. 10 again, the support structure 110 has a rotating shaft region 1101 and a planar region 1102. The fourth adhesive material layer 120 is bonded between the planar region 1102 and the support plate 20. That is, a hollow 1201 is provided in the fourth adhesive material layer 120. The hollow 1201 is opposite to the rotating shaft region 1101.

Because the foldable display device is bendable, during bending of the foldable display device, the rotating shaft region 1101 generates a bending force to cause the support structure 110 to be deformed in the rotating shaft region 1101. The fourth adhesive material layer 120 is only configured to bond the planar region 1102 of the support structure 110 and the support plate 20, the hollow 1201 is provided in the fourth adhesive material layer 120 opposite to the rotating shaft region 1101, and no adhesive material is present in the hollow 1201, causing the support structure 110 to be more easily deformable in the rotating shaft region 1101, to facilitate bending of the support structure 110.

In the embodiments of the present disclosure, a hinge may be disposed in the rotating shaft region 1101, and two planar regions 1102 are both rotatable around the hinge, such that the rotation of the support structure 110 is achieved.

In the embodiments of the present disclosure, a hollow or groove may be disposed in the rotating shaft region 1101 of the support structure 110 to improve the bending performance of the rotating shaft region 1101 of the support structure 110.

For example, the support structure 110 is a metal support plate. For example, the support structure 110 is a stainless steel support plate, such that the supporting performance of the support structure 110 is ensured, and the bending performance of the support structure 110 is also ensured.

For example, the fourth adhesive material layer 120 is an optical adhesive layer, a foam adhesive layer, or an acrylic adhesive layer.

Referring to FIG. 6, FIG. 7, FIG. 9, and FIG. 10 again, the foldable display device further includes a connecting layer 180. The connecting layer 180 connects the motherboard 40 and the support structure 110.

For example, the connecting layer 180 is an optical adhesive layer, a foam adhesive layer, or an acrylic adhesive layer.

In other embodiments, the motherboard 40 and the support structure 110 may be riveted, connected with a nut, soldered, or connected in other assembly processes.

The foldable display device according to the embodiments of the present disclosure may be a mobile terminal, for example, a mobile phone, a tablet computer, a television, a display, a notebook computer, a digital frame, a navigator or any other product or component having a display function.

Figure 11:
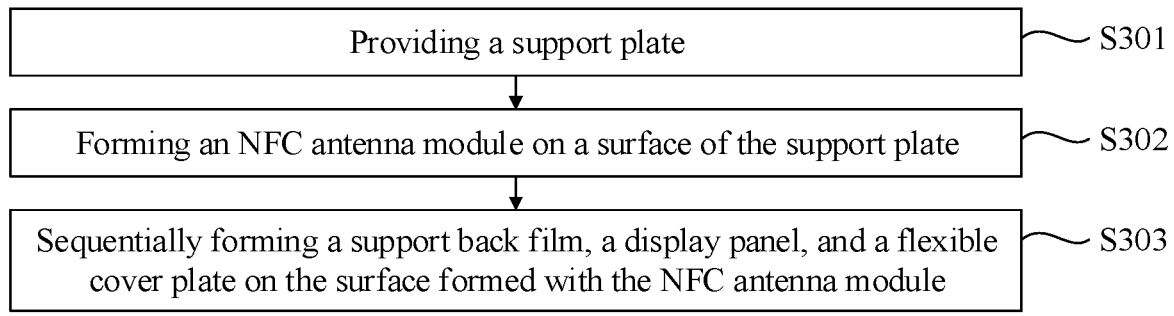
FIG. 11 shows a method for manufacturing a foldable display device according to an embodiment of the present disclosure.

FIG. 11 shows a method for manufacturing a foldable display device according to an embodiment of the present disclosure. Referring to FIG. 11, the method includes the following steps.

In step 301, a support plate is provided.

For example, the support plate may be a stainless steel sheet or a Cu foil.

In step 302, an NFC antenna module is formed on a surface of the support plate.

For example, the NFC antenna module includes an antenna coil and an antenna feeder line. The antenna feeder line is electrically connected to the antenna coil. A wiring width of the antenna feeder line is greater than a wiring width of the antenna coil.

For example, a third adhesive material layer and a first adhesive material layer are first applied to one surface of the support plate. The thickness of the third adhesive material layer is greater than the thickness of the first adhesive material layer. Then a magnetic conductive layer is attached on the first adhesive material layer. Next, the NFC antenna module is attached on the magnetic conductive layer. Then a second adhesive material layer is attached on the magnetic conductive layer.

The positions and structures of the third adhesive material layer, the first adhesive material layer, the magnetic conductive layer, the NFC antenna module, and the second adhesive material layer are all the same as those discussed above. Details are not described again herein.

In step 303, a support back film, a display panel, and a flexible cover plate are sequentially formed on the surface formed with the NFC antenna module.

For example, the display panel is a flexible OLED display panel.

For example, the support back film is attached on the second adhesive material layer and the third adhesive material layer. Next, the display panel is attached to the support back film by a back film adhesive layer.

For example, the method further includes: attaching a functional module layer on the display panel; attaching the flexible cover plate on the functional module layer by a modular adhesive layer; applying a fourth adhesive material layer to the other surface of the support plate, and bonding a support structure on one surface of the support plate by the fourth adhesive material layer; and attaching a connecting layer on a motherboard by the support structure.

After the support structure is attached to the motherboard, the motherboard may be electrically connected to the NFC antenna module by an FPC.

Alternatively, the motherboard and the NFC antenna module are connected by a conductive structure. In the manufacturing method, before the magnetic conductive layer, the support structure, and the support plate are attached, through holes first need to be provided in advance in the magnetic conductive layer, the support structure, and the support plate. When the magnetic conductive layer and the support structure are bonded by the first adhesive material layer, the through hole in the support structure and the through hole in the magnetic conductive layer are placed in communication with each other. When the support structure and the support plate are bonded by the fourth adhesive material layer, the through hole in the support structure and the through hole in the support plate are placed in communication with each other. After the magnetic conductive layer, the support structure, and the support plate are attached, the conductive structure is formed in the through holes, to electrically connect the NFC antenna module and the motherboard.

For details about the structures of the fourth adhesive material layer, the support structure, the support back film, the back film adhesive layer, the display panel, the functional module layer, the modular adhesive layer, the flexible cover plate, the connecting layer, the motherboard, the FPC, and the conductive structure, reference may be made to the above structures, which are not described herein again.

Described above are merely optional embodiments of the present disclosure but is not used to limit the present disclosure. Any changes, equivalent replacements, and improvements made shall fall within the protection scope of the present disclosure, without departing from the spirit and principles of the present disclosure.

What is claimed is:

1. A foldable display device, wherein the foldable display device comprises a first planar display region, a bendable display region, and a second planar display region that are sequentially connected in a first direction;
   the foldable display device comprises a first near-field communication (NFC) antenna module and a support plate, a support back film, a display panel, and a flexible cover plate that are laminated;
   wherein the first NFC antenna module is partially overlapped with at least one planar display region of the first planar display region and the second planar display region, and when the first NFC antenna module is at least partially not overlapped with the bendable display region, the first NFC antenna module is disposed between the support plate and the support back film; and
   the support back film and the first NFC antenna module are both disposed on a non-light-emitting side of the display panel, wherein the support back film is disposed between the display panel and the first NFC antenna module and is adhered to the display panel, and the support back film is a polyethylene film or a polyimide film;
   the support plate is a metal support plate, and the foldable display device further comprises:
     a magnetic conductive layer, disposed between the support plate and the first NFC antenna module;
     a first adhesive material layer, bonded between the magnetic conductive layer and the support plate;
     a second adhesive material layer, bonded between the first NFC antenna module and the support back film; and
     a third adhesive material layer, bonded between the support plate and the support back film, wherein a surface of the third adhesive material layer opposite to the support plate is attached to the support plate, and a surface of the first adhesive material layer opposite to the support plate is attached to the support plate.

2. The foldable display device according to claim 1, wherein the foldable display device further comprises a motherboard and a flexible circuit board (FPC), the support plate is disposed between the first NFC antenna module and the motherboard, and the first NFC antenna module is electrically connected to the motherboard by the FPC.

3. The foldable display device according to claim 2, wherein a wiring width of the FPC is greater than or equal to a wiring width of the first NFC antenna module.

4. The foldable display device according to claim 3, wherein the wiring width of the FPC ranges from 2 mm to 5 mm, and the wiring width of the first NFC antenna module ranges from 0.1 mm to 2 mm.

5. The foldable display device according to claim 1, wherein
   the foldable display device further comprises a motherboard and a conductive structure, and the support plate is disposed between the first NFC antenna module and the motherboard; and
   a through hole is provided in the support plate, the conductive structure is disposed in the through hole, and the first NFC antenna module is electrically connected to the motherboard by the conductive structure.

6. The foldable display device according to claim 5, wherein
   the conductive structure is a conductive adhesive; or
   the conductive structure is a metal elastic sheet; or
   the conductive structure is a lead.

7. The foldable display device according to claim 5, wherein
   the conductive structure is soldered to the motherboard; or
   the conductive structure and the motherboard are connected by a crimping adhesive.

8. The foldable display device according to claim 1, wherein
the first NFC antenna module is disposed in the one planar display region of the first planar display region and the second planar display region.

9. The foldable display device according to claim 1, wherein
the first NFC antenna module comprises an antenna coil and an antenna feeder line, and the antenna feeder line is electrically connected to the antenna coil; and
a wiring width of the antenna feeder line is greater than a wiring width of the antenna coil.

10. The foldable display device according to claim 9, wherein
the wiring width of the antenna coil ranges from 0.1 mm to 2 mm; and
the wiring width of the antenna feeder line ranges from 0.5 mm to 5 mm.

11. The foldable display device according to claim 9, wherein the antenna coil is a copper (Cu) coil or a silver (Ag) coil or an aluminum (Al) coil.

12. The foldable display device according to claim 9, wherein
a wiring distance of the antenna coil ranges from 0.1 mm to 1 mm, and an inductance of the antenna coil is greater than 0.3 μH; and
a relative magnetic permeability of the antenna coil is greater than 150, and a magnetic loss of the antenna coil is less than 100.

13. The foldable display device according to claim 1, wherein a material of the magnetic conductive layer is at least one of ferrite, noncrystal or ferrous nanocrystal.

14. The foldable display device according to claim 1, wherein a difference between a thickness of the third adhesive material layer and a sum of a thickness of the first adhesive material layer, a thickness of the magnetic conductive layer, a thickness of the first NFC antenna module, and a thickness of the second adhesive material layer is less than 10 μm.

15. The foldable display device according to claim 1, wherein the thickness of the first adhesive material layer ranges from 15 μm to 50 μm, the thickness of the magnetic conductive layer ranges from 15 μm to 50 μm, the thickness of the first NFC antenna module ranges from 1 μm to 35 μm, and the thickness of the second adhesive material layer ranges from 15 μm to 50 μm.

16. The foldable display device according to claim 1, wherein
the foldable display device further comprises a support structure and a fourth adhesive material layer; and
the support structure comprises a rotating shaft region and a planar region, and the fourth adhesive material layer is bonded between the planar region and the support plate.

17. The foldable display device according to claim 1, wherein
the foldable display device comprises a second NFC antenna module, and the first NFC antenna module and the second NFC antenna module are respectively disposed in the first planar display region and the second planar display region.

18. A method for manufacturing a foldable display device, comprising:
providing a support plate;
forming a first near-field communication (NFC) antenna module on a surface of the support plate; and
sequentially forming a support back film, a display panel, and a flexible cover plate on the surface formed with the first NFC antenna module;
the support back film and the first NFC antenna module are both disposed on a non-light-emitting side of the display panel, wherein the support back film is disposed between the display panel and the first NFC antenna module and is adhered to the display panel, and the support back film is a polyethylene film or a polyimide film;
wherein the support plate is a metal support plate, and the foldable display device further comprises:
a magnetic conductive layer, disposed between the support plate and the first NFC antenna module;
a first adhesive material layer, bonded between the magnetic conductive layer and the support plate;
a second adhesive material layer, bonded between the first NFC antenna module and the support back film; and
a third adhesive material layer, bonded between the support plate and the support back film, wherein a surface of the third adhesive material layer opposite to the support plate is attached to the support plate, and a surface of the first adhesive material layer opposite to the support plate is attached to the support plate.

\* \* \* \* \*